(12) United States Patent
Vedula et al.

(10) Patent No.: US 8,149,551 B2
(45) Date of Patent: Apr. 3, 2012

(54) SYSTEMS AND METHODS INVOLVING MOTOR DRIVE GROUND FAULT INTERRUPTS

(75) Inventors: Sastry V. Vedula, Loves Park, IL (US); Carl A. Wagner, Beloit, WI (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 386 days.

(21) Appl. No.: 12/421,256

(22) Filed: Apr. 9, 2009

(65) Prior Publication Data

US 2010/0259099 A1 Oct. 14, 2010

(51) Int. Cl.
*H02H 5/04* (2006.01)
(52) U.S. Cl. ............................................ 361/42; 361/23
(58) Field of Classification Search ..................... 361/23, 361/42–50
See application file for complete search history.

(56) References Cited

U.S. PATENT DOCUMENTS

| | | | |
|---|---|---|---|
| 4,594,537 A | 6/1986 | Arifian et al. | |
| 4,957,182 A | 9/1990 | Morishita et al. | |
| 4,980,622 A | 12/1990 | Grant et al. | |
| 5,214,575 A * | 5/1993 | Sugishima et al. | 363/37 |
| 5,303,142 A | 4/1994 | Parsons et al. | |
| 5,945,802 A | 8/1999 | Konrad et al. | |
| 6,037,752 A | 3/2000 | Glennon | |
| 7,298,282 B2 | 11/2007 | Gustafson et al. | |
| 2005/0099743 A1 * | 5/2005 | Lee | 361/42 |
| 2006/0198068 A1 * | 9/2006 | Takahashi et al. | 361/42 |
| 2009/0296289 A1 * | 12/2009 | Valdez et al. | 361/47 |

OTHER PUBLICATIONS

Nelson, John P., "System Grounding and Ground Fault Protection in the Petrochemical Industry: A Need for a Better Understanding", IEEE Transactions on Industry Application, vol. 38, No. 6, Nov./Dec. 2002, pp. 1633-1640.

Skibinski et al., "Effect of Adjustable-Speed Drives on the Operation of Low-Voltage Ground-Fault Indicators", IEEE Transactions on Industry Application, vol. 37, No. 5, Sep./Oct. 2001 pp. 1423-1437.

Tallum et al., "Failure Mode for AC Drives on High Resistance Grounded Systems", IEEE APEC 2006, Dallas (TX), Mar. 19-23, 2006, pp. 1587-1591.

Venkateswaran et al., "Failure Mechanism of Variable Frequency Drives in Ungrounded Distribution Systems", 2004 11th International Conference on Harmonics and Quality of Power, 1587-1591.

* cited by examiner

*Primary Examiner* — Danny Nguyen
(74) *Attorney, Agent, or Firm* — Cantor Colburn LLP

(57) ABSTRACT

A method comprises determining whether a ground fault on a bus (110) operative to drive the system (100) exceeds a first threshold level, (502) receiving values of phase currents of a first motor, (504) calculating a sum of the values of the phase currents of the first motor (106) responsive to determining that the ground fault on the bus exceeds the first threshold value, and (504) determining whether the sum of the values of the phase currents of the first motor (106) exceeds a second threshold value (506).

18 Claims, 6 Drawing Sheets

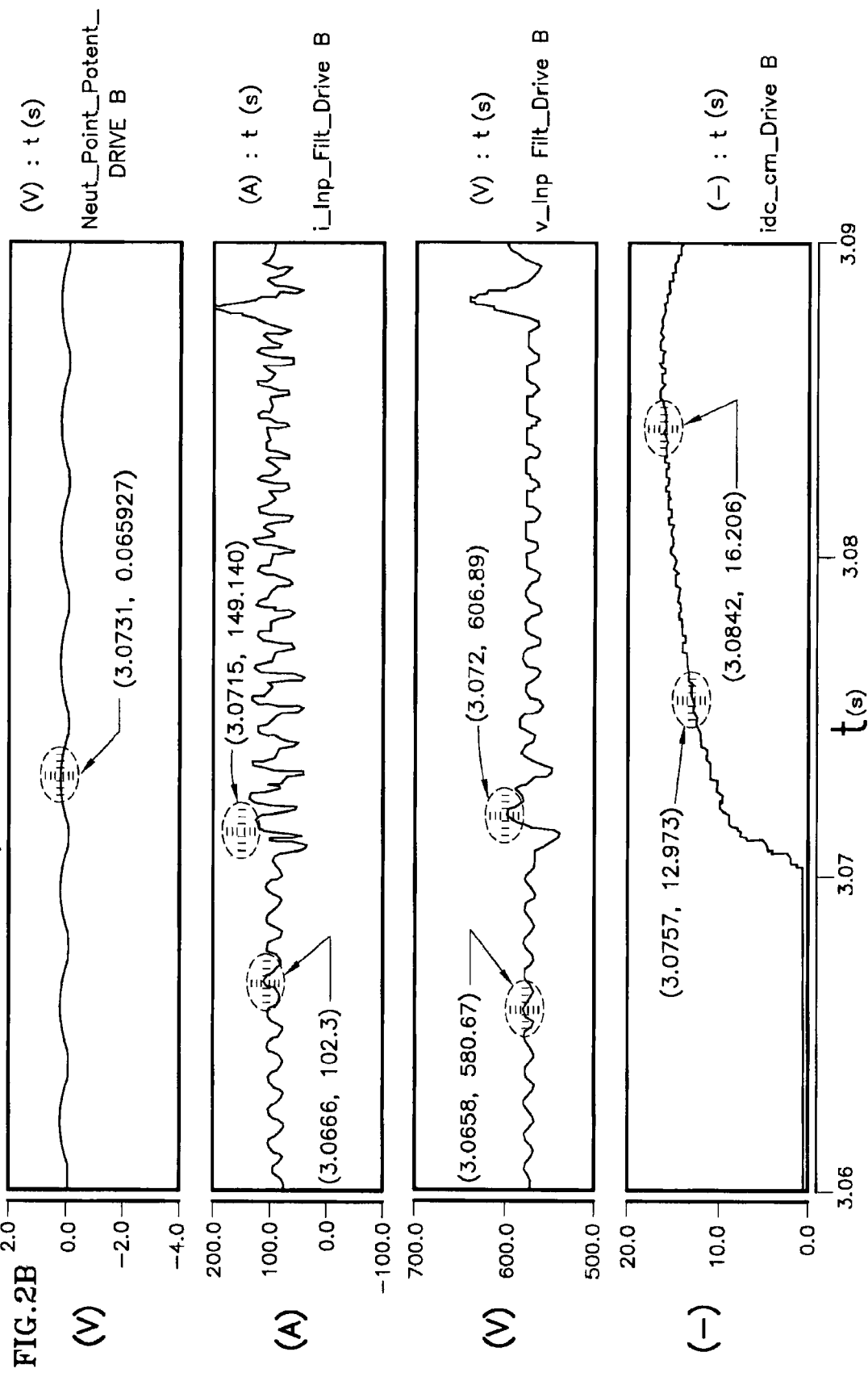

SYSTEMS AND METHODS INVOLVING MOTOR DRIVE GROUND FAULT INTERRUPTS

BACKGROUND OF THE INVENTION

The subject matter disclosed herein relates to sensing ground faults in motor drive systems and particularly in systems having multiple motor drives.

Motor systems used in, for example, aircraft applications use an inverter connected to a direct current (DC) bus. The inverter drives a three phase motor. A paired motor and inverter are called a motor drive. Motor drive systems may include a number of drives connected to a common DC bus. Ground fault interrupter (GFI) system typically senses a ground fault on the bus and trips all of the drives connected to the common DC bus off line. Since typical ground faults occur in a single drive, tripping all of the drives due to a fault in a single drive is often unnecessary and undesirable.

BRIEF DESCRIPTION OF THE INVENTION

According to one aspect of the invention, a method comprises determining whether a ground fault on a bus operative to drive the system exceeds a first threshold level, receiving values of phase currents of a first motor, calculating a sum of the values of the phase currents of the first motor responsive to determining that the ground fault on the bus exceeds the first threshold value, and determining whether the sum of the values of the phase currents of the first motor exceeds a second threshold value.

According to another aspect of the invention, a method comprises determining whether a ground fault current on a bus operative to drive the system exceeds a first threshold level, receiving a voltage value of a neutral node of a first filter connected to a first motor responsive to determining that the ground fault on the bus exceeds the first threshold value, and determining whether the voltage value of the neutral node of the first filter exceeds a second threshold value.

According to yet another aspect of the invention, a system comprises a first motor, a first inverter connected to the first motor operative to receive power from a bus and output multiphase power to the first motor, and a first processor operative to determine whether a ground fault on the bus exceeds a first threshold level, receive values of phase currents of the first motor, calculate a sum of the values of the phase currents of the first motor responsive to determining that the ground fault on the bus exceeds the first threshold value, and determine whether the sum of the values of the phase currents of the first motor exceeds a second threshold value.

These and other advantages and features will become more apparent from the following description taken in conjunction with the drawings.

BRIEF DESCRIPTION OF THE DRAWING

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 2B illustrates exemplary graphical results from a simulation of the operation of the system of FIG. 1.

The detailed description explains embodiments of the invention, together with advantages and features, by way of example with reference to the drawings.

DETAILED DESCRIPTION OF THE INVENTION

Figure 1:
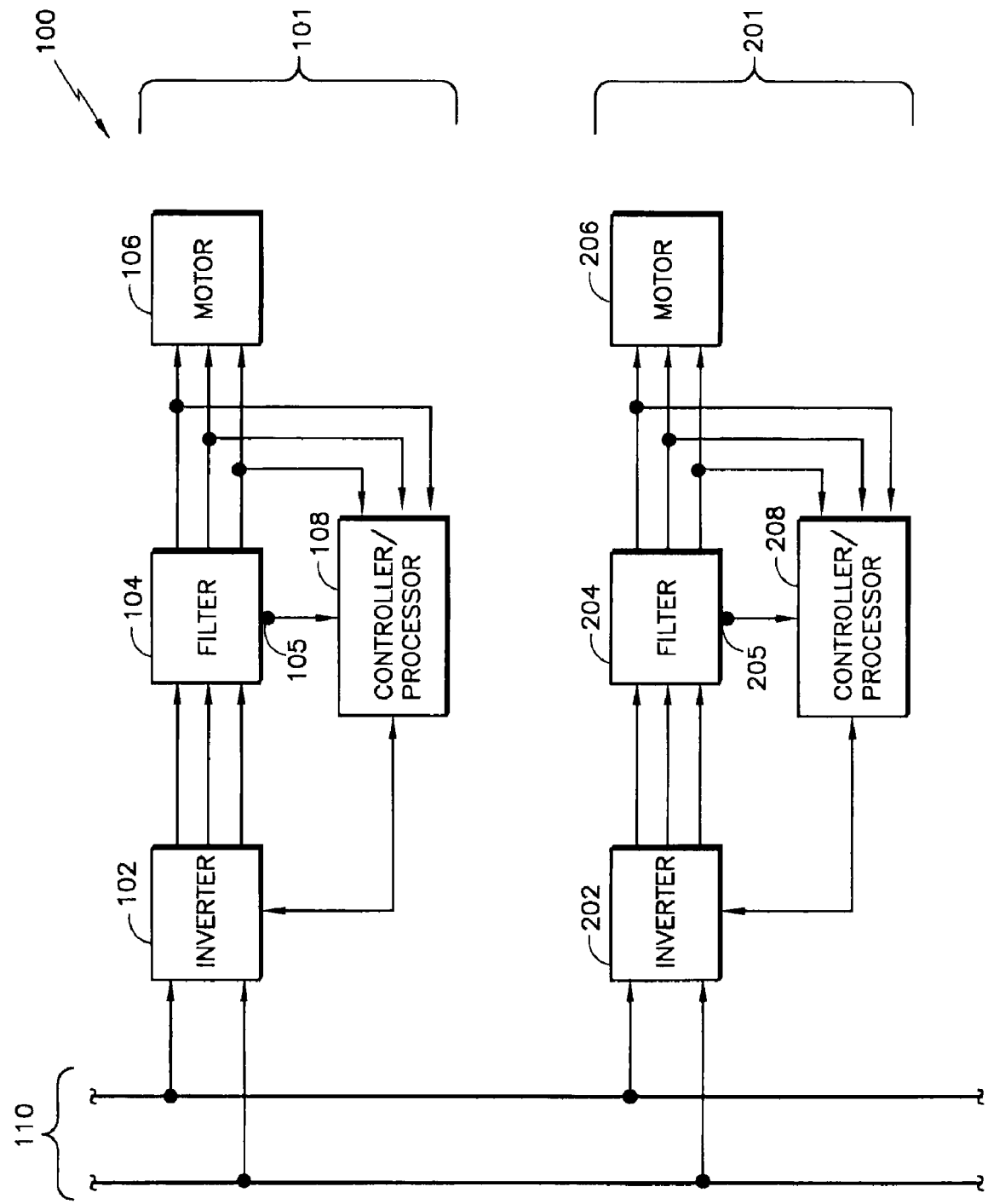
FIG. 1 is a block diagram of an exemplary embodiment of a multi-motor drive system.

FIG. 1 illustrates a block diagram of an exemplary embodiment of a motor drive system 100. The system 100 includes a direct current (DC) bus 110 connected to a first motor drive portion 101 that includes an inverter 102, a filter 104, a motor 106, and a controller 108. The inverter 102 is connected to the filter 104. The filter is connected to the motor 106. The controller 108 includes a processor communicatively connected to the inverter 102, the filter 104, and nodes disposed between the output of the filter 104 and the input of the motor 106. In operation, the inverter converts power from the DC bus 110 into three-phase power that is filtered by the filter 104. The filtered three-phase power drives the motor 106. The controller 108 controls the inverter 102 and receives input from the filter 104 and the motor nodes. The illustrated embodiment includes a second motor drive portion 201 that is similar to the first motor driver portion 101. Other exemplary embodiments may include any number of motor driver portions connected to the common DC bus 110, or motors that may operate with any type of multi-phase power, for example, two/five/six-phase power.

In operation, the controller 108 includes a circuit that is operative to detect a ground fault in the system 100. Previous systems used ground fault interrupter (GFI) logic to determine whether the ground fault current detected in the system exceeded a defined threshold value. If a ground fault current that exceeded the threshold, the controller 108 would shut down all motor drives connected to the common DC bus 110. A shut down of each of the motor drive portions connected to the common DC bus 110 reduced or prevented damage to the system 100, however the GFI logic unnecessarily shut down all the motor drives regardless of whether a particular motor drive was the cause of the ground fault. The GFI logic was unable to determine which motor drive portion was the cause of the ground fault because the motor drive portions are commonly grounded and not isolated, typically due to common coupling capacitors on the DC link side of an input filter (not shown). Thus, a single ground fault in a particular motor drive portion resulted in a shut down of all of the motor drive portions in the system 100. The system 100 may include a number of motor drives for system redundancy. Systems and methods for determining which motor drive has caused a ground fault and shutting down the grounded motor drive portion without shutting down any of the healthy motor drives in the system 100 are described below.

Figure 2A:
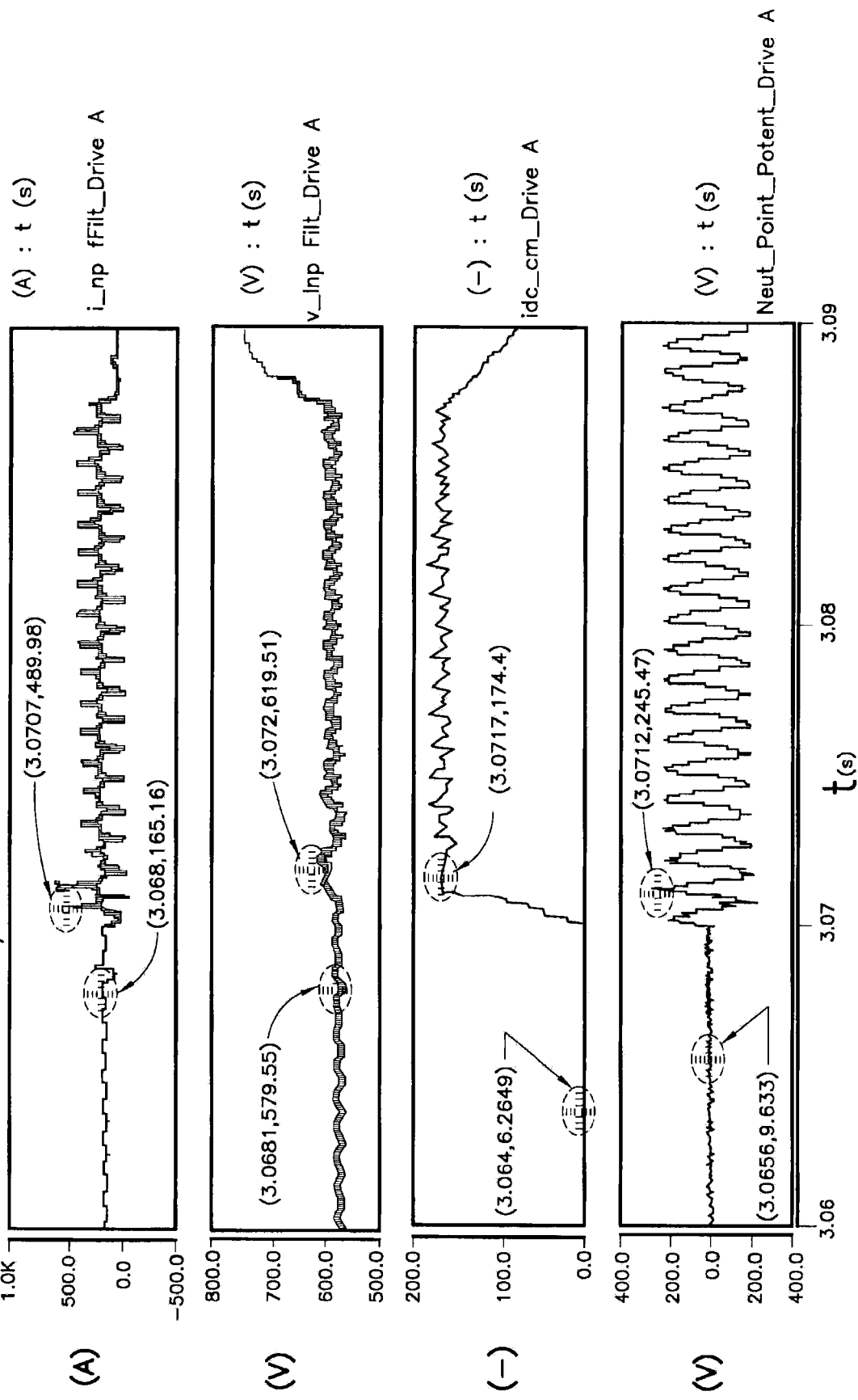
FIG. 2A illustrates exemplary graphical results from a simulation of the operation of the system of FIG. 1.

The filter 104 includes a neutral point 105 node. The value of the potential of the neutral point node is received and processed by the processor 108. FIG. 2A illustrates exemplary graphical results of a simulation showing a ground fault in the first motor drive portion 101 (of FIG. 1) (Drive A) (indicated in the second graph from the bottom of FIG. 2A) indicated by a rapid and large rise in the common mode DC link current (idc_cm_Drive A) at time 3.0717 where the current has risen to 174.4 amps. The value of the measured potential at the neutral point 105 node (Neut_Point_Potent_Drive A, shown in the bottom graph of FIG. 2A) peaks at time 3.0712 at 245.47 volts—also indicating a ground fault in the first motor drive portion 101. FIG. 2B illustrates exemplary graphical results of the simulation showing no ground fault in the second motor drive portion 201 (of FIG. 1) (Drive B) (indicated in the graph at the bottom of FIG. 2B) indicated by no significant rise in the common mode DC link current (idc_cm_Drive B) at time 3.0757 where the current has risen to 12.973 amps. The value of the measured potential at the neutral point 205 node (Neut_Point_Potent_Drive B, shown in the top graph of FIG. 2B) peaks at time 3.0731 at 0.085927 volts—indicating a no ground fault in the second motor drive portion 201. Thus, the simulation results shown in FIGS. 2A and 2B demonstrate that the value of the potential at the neutral point 105/205 node may be used to determine if a particular drive portion of the system 100 has experienced a ground fault.

Figure 3:
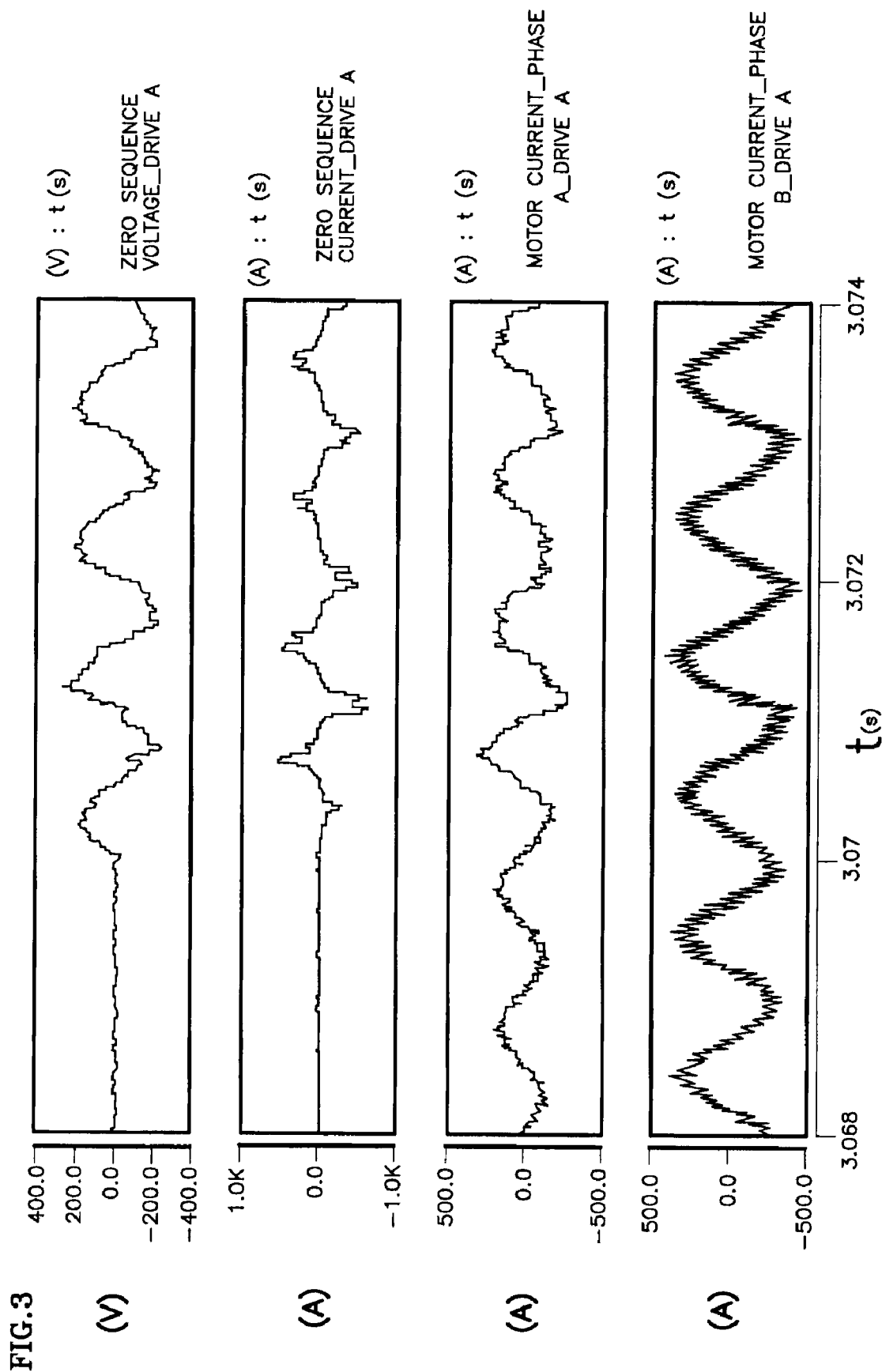
FIG. 3 illustrates exemplary graphical results from a simulation of the operation of the system of FIG. 1.

FIG. 3 illustrates exemplary graphical results of the simulation indicating a ground fault in the first motor drive portion 101 (of FIG. 1) (Drive A) using the sum of the three-phase currents/voltages. The second graph from the bottom of FIG. 3 shows the current of the Phase A current of the first motor drive portion 101, and the bottom graph of FIG. 3 shows the current of Phase B the first motor drive portion 101. The Phase C current of the first motor drive portion 101 is not shown. The third graph from the bottom of FIG. 3 illustrates the zero sequence current of first motor drive portion 101. The zero sequence current is the sum of the currents of all phases of that drive feeding the motor 106. At approximately time 3.0717 sec, the zero sequence current becomes non-zero and exceeding the threshold indicating a ground fault in the first motor drive portion. The values of the potential at the neutral point 105 node and the zero sequence current may be used alone or together to determine whether a particular motor drive portion has experienced a ground fault, thus allowing the particular motor drive with the ground fault to be shutdown.

Figure 4:
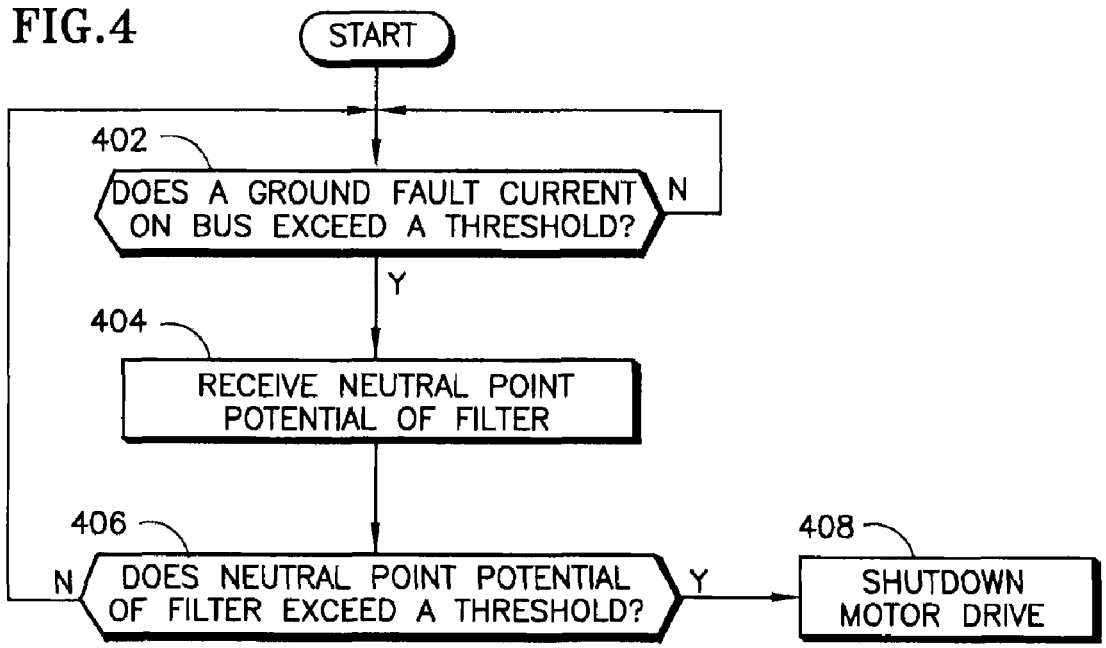
FIG. 4 illustrates a block diagram of an exemplary method for detecting ground fault in a motor drive of the system shown in FIG. 1.

FIG. 4 illustrates a block diagram of an exemplary method for detecting ground faults making use of all phase voltages in the system 100 (of FIG. 1). In block 402 the processor 108 determines whether a ground fault on the drive 101/201 exceeds a first threshold level. If the ground fault exceeds the first threshold level, the neutral point potential of the filter 105 is received in block 404. In block 406, the processor 108 determines whether the neutral point potential of the filter 105 exceeds a second defined threshold value. If the neutral point potential exceeds the second defined threshold value, the motor drive is shut down in block 408.

Figure 5:
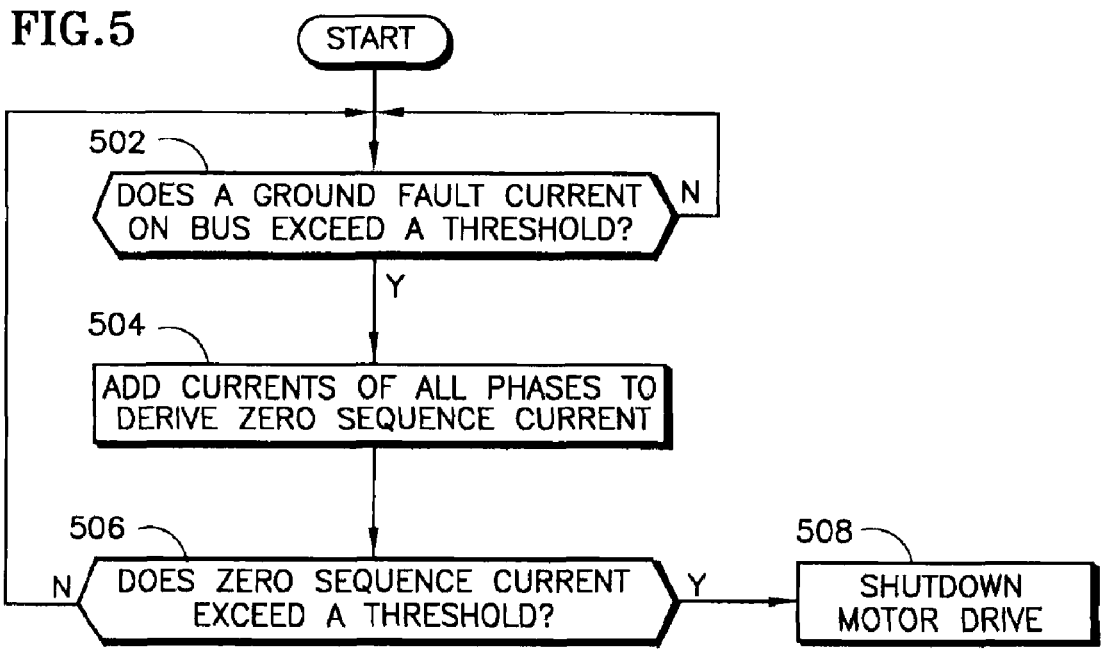
FIG. 5 illustrates a block diagram of an alternate exemplary method for detecting ground fault in a motor drive of the system shown in FIG. 1.

FIG. 5 illustrates a block diagram of an alternate exemplary method for detecting ground faults making use of all phase currents in the system 100 (of FIG. 1). In block 502 the processor 108 determines whether a ground fault on the drive A/B exceeds the first threshold level. If the ground fault current exceeds the first threshold level, the currents of each phase of the motor are added to calculate the zero sequence current in block 504. In block 506, the processor determines whether the zero sequence current exceeds a third defined threshold value (such as, for example +/−(x) amps). If the zero sequence current exceeds the third defined threshold value, the motor driver is shutdown in block 508.

Figure 6:
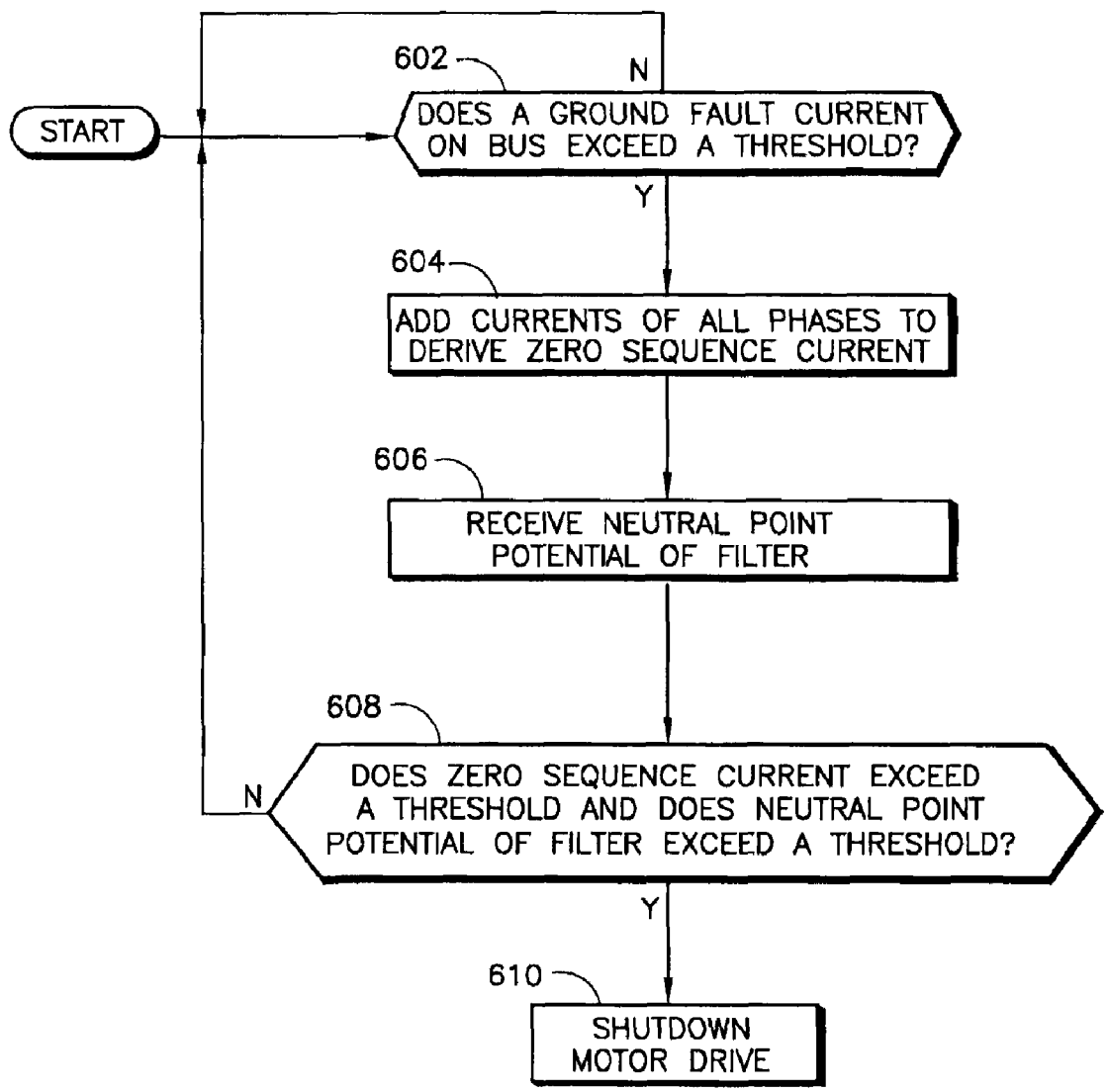
FIG. 6 illustrates a block diagram of another alternate exemplary method for detecting ground faults in a motor drive of the system of FIG. 1.

FIG. 6 illustrates a block diagram of another alternate exemplary method for detecting ground faults in the system 100 (of FIG. 1). In block 602 the processor 108 determines whether a ground fault current of a drive 101/201 exceeds a first threshold level. If the ground fault current exceeds the first threshold level, the currents of each phase of the motor are added to calculate the zero sequence current in block 604. The neutral point potential of the filter 104/204 is received in block 606. In block 608, the processor determines whether the zero sequence current exceeds a second defined threshold value and whether the neutral point potential of the filter 104/204 exceeds a third defined threshold value. If the zero sequence current exceeds the second defined threshold value, and the neutral point potential exceeds the third defined threshold value, that particular motor drive only is shutdown in block 610.

The technical effects and benefits of the embodiments allow a multi-motor driver system using a common bus experiencing a ground fault in a particular motor drive and to determine which motor drive has experienced the ground fault and shutdown the grounded motor drive without shutting down all of the motor drives in the system.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method for controlling a system comprising:
    determining whether a ground fault on a bus (110) operative to drive the system (100) exceeds a first threshold level; (502)
    receiving values of phase currents of a first motor; (504)
    calculating a sum of the values of the phase currents of the first motor (106) responsive to determining that the ground fault on the bus exceeds the first threshold value; (504)
    determining whether the sum of the values of the phase currents of the first motor (106) exceeds a second threshold value; (506)
    receiving values of phase currents of a second motor; (504)
    calculating a sum of the values of the phase currents of the second motor (106) responsive to determining that the ground fault on the bus exceeds the first threshold value; and (504)
    determining whether the sum of the values of the phase currents of the second motor exceeds the second threshold value (506).

2. The method of claim 1, wherein the method further comprises sending a signal operative to stop the first motor responsive to determining that the sum of the values of the phase currents of the second motor exceeds the second threshold value (508).

3. The method of claim 1, wherein the method further comprises sending a signal operative to stop the second motor responsive to determining that the sum of the values of the phase currents of the second motor exceeds the second threshold value (508).

4. The method of claim 1, wherein the method further comprises:
  receiving a voltage value of a neutral node of a first filter connected to the first motor; (404)
  determining whether the voltage value of the neutral node of the first filter exceeds a third threshold value; and (406)
  sending a signal operative to stop the first motor responsive to determining that the voltage value exceeds the third threshold value (408).

5. The method of claim 1, wherein the method further comprises:
  receiving a voltage value of a neutral node of a first filter connected to the first motor; (606)
  determining whether the voltage value of the neutral node of the first filter exceeds a third threshold value; and (608)
  sending a signal operative to stop the first motor responsive to determining that the sum of the values of the phase currents of the second motor exceeds the second threshold value and determining that the voltage value of the neutral node of the first filter exceeds the third threshold value (608).

6. The method of claim 1, wherein the values of the phase currents of the first motor are measured at an input node of the first motor (106).

7. The method of claim 1, wherein the values of the neutral point potential of the first motor is measured at a node disposed between a first filter and an input of the first motor (106).

8. The method of claim 5, wherein the first filter (104) is operative to filter multi-phase power from a first inverter (102).

9. A method for controlling a system comprising:
  determining whether a ground fault current on a bus operative to drive the system exceeds a first threshold level; (402)
  receiving a voltage value of a neutral node of a first filter connected to a first motor responsive to determining that the ground fault on the bus exceeds the first threshold value; and (404)
  determining whether the voltage value of the neutral node of the first filter exceeds a second threshold value (406).

10. The method of claim 9, wherein the method further comprises:
  receiving a voltage value of a neutral node of a second filter connected to a second motor responsive to determining that the ground fault on the bus exceeds the first threshold value; and (404)
  determining whether the voltage value of the neutral node of the second filter exceeds the second threshold value (406).

11. The method of claim 9, wherein the method further comprises sending a signal operative to stop the first motor responsive to determining that the voltage value of the neutral node of the first filter exceeds the second threshold value (408).

12. The method of claim 10, wherein the method further comprises sending a signal operative to stop the second motor responsive to determining that the voltage value of the neutral node of the second filter exceeds the second threshold value (408).

13. The method of claim 9, wherein the method further comprises:
  receiving values of phase currents of a first motor; (504)
  calculating a sum of the values of the phase currents of the first motor; (504)
  responsive to determining that the ground fault on the bus exceeds the first threshold value; and (504)
  determining whether the sum of the values of the phase currents of the first motor exceeds a third threshold value (506).

14. The method of claim 13, wherein the method further comprises sending a signal operative to stop the first motor responsive to determining that the sum of the values of the phase currents of the first motor exceeds the third threshold value (508).

15. A system comprising:
  a first motor; (106)
  a first inverter (102) connected to the first motor (106) operative to receive power from a bus (110) and output multi-phase power to the first motor (106);
  a first processor (108) operative to:
    determine whether a ground fault on the bus (110) exceeds a first threshold level, receive values of phase currents of the first motor (106);
    calculate a sum of the values of the phase currents of the first motor (106) responsive to determining that the ground fault on the bus (110) exceeds the first threshold value; and
    determine whether the sum of the values of the phase currents of the first motor (106) exceeds a second threshold value;
  a second motor (206);
  a second inverter (202) connected to the second motor (206) operative to receive power from the bus (110) and output multi-phase power to the second motor (206); and
  a second processor (208) operative to:
    determine whether a ground fault on the bus (110) exceeds the first threshold level, receive values of phase currents of the second motor (206);
    calculate a sum of the values of the phase currents of the second motor (206) responsive to determining that the ground fault on the bus (110) exceeds the first threshold value; and
    determine whether the sum of the values of the phase currents of the second motor (206) exceeds the second threshold value.

16. The system of claim 15, wherein the first processor (108) is further operative to send a signal operative to stop the first motor (106) responsive to determining that the sum of the values of the phase currents of the first motor (106) exceeds the second threshold value.

17. The system of claim 15, wherein the second processor (208) is further operative send a signal operative to stop the second motor (206) responsive to determining that the sum of the values of the phase currents of the second motor (206) exceeds the second threshold value.

18. The method of claim 15, wherein the processor is further operative to receive a voltage value of a neutral node of a first filter (105) operative to filter the multi-phase power output from the first inverter (102), determine whether the voltage value of the neutral node of the first filter (105) exceeds a third threshold value, and send a signal operative to stop the first motor (106) responsive to determining that the voltage value of the neutral node of the first filter (105) exceeds the third threshold value.

* * * * *